United States Patent
Ma (10) Patent No.: US 10,127,862 B2
(45) Date of Patent: Nov. 13, 2018

(54) SHIFT REGISTER UNIT, GATE DRIVE CIRCUIT AND DISPLAY PANEL (71) Applicant: BOE TECHNOLOGY GROUP CO., LTD., Beijing (CN)

(72) Inventor: Zhanjie Ma, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 0 days.

(21) Appl. No.: 15/531,377

(22) PCT Filed: Jun. 23, 2016

(86) PCT No.: PCT/CN2016/086830
§ 371 (c)(1),
(2) Date: May 26, 2017

(87) PCT Pub. No.: WO2017/156909
PCT Pub. Date: Sep. 21, 2017

(65) Prior Publication Data
US 2018/0047341 A1   Feb. 15, 2018

(30) Foreign Application Priority Data

Mar. 16, 2016  (CN) .......................... 2016 1 0151375

(51) Int. Cl.
G09G 3/3266 (2016.01)
G09G 3/36 (2006.01)
G11C 19/28 (2006.01)

(52) U.S. Cl.
CPC ......... *G09G 3/3266* (2013.01); *G09G 3/3677* (2013.01); *G11C 19/28* (2013.01); *G09G 2310/0286* (2013.01)

(58) Field of Classification Search
CPC .. G09G 3/3266; G09G 3/3674; G09G 3/3677; G09G 2310/0286; G11C 19/28
See application file for complete search history.

(56) References Cited

U.S. PATENT DOCUMENTS 9,019,192 B2 * 4/2015 Ma .................. G09G 3/3611
                                          345/100
9,626,933 B2 * 4/2017 Zheng .............. G09G 5/003
(Continued)

FOREIGN PATENT DOCUMENTS

CN      1758321 A      4/2006
CN    101939791 A      1/2011
(Continued)

OTHER PUBLICATIONS

International Search Report and Written Opinion dated Dec. 26, 2017, for corresponding PCT Application No. PCT/CN2016/086830.

*Primary Examiner* — Patrick O'Neill
(74) *Attorney, Agent, or Firm* — Kinney & Lange, P.A.

(57) ABSTRACT

The present application discloses a shift register, a gate drive circuit and a display panel. In the shift register, the first node control sub-circuit provides a signal of the input signal terminal to the first node, and provides a signal of the first reference signal terminal to the first node; the second node control sub-circuit provides a signal of the second reference signal terminal to the second node, and provides a signal of the third clock signal terminal to the second node; the first output sub-circuit provides a signal of the second clock signal terminal to the output terminal for stabilizing a voltage difference between the first node and the output terminal when the first node is in a floating state; and the second output sub-circuit provides the signal of the first reference signal terminal to the output terminal.

13 Claims, 8 Drawing Sheets

(56) References Cited

U.S. PATENT DOCUMENTS

| 2017/0124936 A1* | 5/2017 | Tseng | G09G 3/2092 |
| 2017/0193916 A1* | 7/2017 | Ma | G09G 3/3266 |
| 2017/0330633 A1* | 11/2017 | Sun | G11C 19/186 |

FOREIGN PATENT DOCUMENTS

| CN | 103943053 A | 7/2014 |
| CN | 105118417 A | 12/2015 |
| CN | 105118418 A | 12/2015 |
| CN | 105632444 A | 6/2016 |
| JP | 2005094335 A | 4/2005 |
| JP | 2009245564 A | 10/2009 |

\* cited by examiner

SHIFT REGISTER UNIT, GATE DRIVE CIRCUIT AND DISPLAY PANEL

CROSS-REFERENCE TO RELATED APPLICATION(S)

This application is a US national phase application of PCT Application No. PCT/CN2016/086830, filed on Jun. 23, 2016, entitled "SHIFT REGISTER UNIT, GATE DRIVE CIRCUIT AND DISPLAY PANEL," which claims priority to Chinese Application No. 201610151375.7, filed on Mar. 16, 2016, both of which are incorporated herein by reference in their entirety.

TECHNICAL FIELD

The present application relates to the field of display technology, and particularly to a shift register, a gate drive circuit and a display panel.

BACKGROUND

With rapid development of display technology, a display is becoming more and more high integration and low cost. GOA (Gate Driver on Array) technology integrates a TFT (Thin Film Transistor) gate switching circuit in an array substrate of a display panel to form a scan drive for the display panel, so that a wiring space of a Bonding area and a Fan-out area of a gate IC (Integrated Circuit) may be omitted, which may not only reduce cost of a product in terms of material cost and manufacturing process, but also may achieve a nice design of display panel having both sides being symmetrical and a narrow frame. Moreover, such an integrated process may also omit a bonding process in a direction of a gate scan line, thereby improving productivity and yield.

A general gate drive circuit is composed of a plurality of cascaded shift registers, and scanning signals are sequentially input to respective rows of gate lines on the display panel through respective stages of shift registers. However, the number of switch transistors in the current shift register is larger, and a structure of the current shift register with the larger number of switch transistors is more complex. Therefore, it still occupies a larger frame area.

SUMMARY

Embodiments of the present application provide a shift register, a gate drive circuit and a display panel for implementing a shift register with a simpler structure.

An embodiment of the present application provides a shift register, comprising:

a first node control sub-circuit, which is connected to an input signal terminal, a first clock signal terminal, a first reference signal terminal, a first node and a second node respectively, the first node control sub-circuit being configured to provide a signal of the input signal terminal to the first node under control of the first clock signal terminal, and provide a signal of the first reference signal terminal to the first node under control of the second node;

a second node control sub-circuit, which is connected to a second reference signal terminal, a third clock signal terminal, the first node and the second node respectively, the second node control sub-circuit being configured to provide a signal of the second reference signal terminal to the second node under control of the third clock signal terminal, and provide a signal of the third clock signal terminal to the second node under control of the first node;

a first output sub-circuit, which is connected to the first node, the second clock signal terminal and an output terminal of the shift register respectively, the first output sub-circuit being configured to provide a signal of the second clock signal terminal to the output terminal under control of the first node, for stabilizing a voltage difference between the first node and the output terminal when the first node is in a floating state; and a second output sub-circuit, which is connected to the second node, the first reference signal terminal and the output terminal respectively, the second output sub-circuit being configured to provide the signal of the first reference signal terminal to the output terminal under control of the second node.

In an example, in the above shift register provided by the embodiment of the present application, the first node control sub-circuit comprises: a first switch transistor and a second switch transistor, wherein the first switch transistor has a gate connected to the first clock signal terminal, a source connected to the input signal terminal, and a drain connected to the first node; and the second switch transistor has a gate connected to the second node, a source connected to the first reference signal terminal, and a drain connected to the first node.

In an example, in the above shift register provided by the embodiment of the present application, the second node control sub-circuit comprises: a third switch transistor and a fourth switch transistor, wherein the third switch transistor has a gate connected to the third clock signal terminal, a source connected to the second reference signal terminal, and a drain connected to the second node; and the fourth switch transistor has a gate connected to the first node, a source connected to the third clock signal terminal, and a drain connected to the second node.

In an example, in the above shift register provided by the embodiment of the present application, the first output sub-circuit comprises: a fifth switch transistor and a first capacitor, wherein the fifth switch transistor has a gate connected to the first node, a source connected to the second clock signal terminal, and a drain connected to the output terminal; and the first capacitor is connected between the gate and the drain of the fifth switch transistor.

In an example, in the above shift register provided by the embodiment of the present application, the second output sub-circuit comprises: a sixth switch transistor, wherein the sixth switch transistor has a gate connected to the second node, a source connected to the first reference signal terminal, and a drain connected to the output terminal.

In an example, in the above shift register provided by the embodiment of the present application, the second output sub-circuit further comprises: a second capacitor connected between the gate and the source of the sixth switch transistor.

In an example, in the above shift register provided by the embodiment of the present application, all of the switch transistors are P-type transistors, or all of the switch transistors are N-type transistors.

Another embodiment of the present application provides a gate drive circuit, comprising a plurality of cascaded shift registers provided by the above embodiments of the present application, wherein an input signal terminal of a first stage of shift register is connected to a start signal terminal; and an input signal terminal of each of stages of shift registers other than the first stage of shift register is connected to an output terminal of its previous stage of shift register.

Yet another embodiment of the present application provides a display panel, comprising a gate drive circuit provided by the above embodiment of the present application.

In an example, the above display panel provided by the embodiment of the present application further comprises: organic electroluminescent pixel rows which are respectively corresponding to the respective stages of shift registers in the gate drive circuit, wherein each of the organic electroluminescent pixel rows emits light under control of a corresponding light-emitting control terminal, and a light-emitting control terminal corresponding to each of the organic electroluminescent pixel rows is connected to the third clock signal terminal of the corresponding stage of shift register.

BRIEF DESCRIPTION OF THE DRAWINGS

FIG. 4a shows a circuit timing diagram of the shift register shown in FIG. 3a;

DETAILED DESCRIPTION

Hereinafter, the embodiments of the shift register, the gate drive circuit and the display panel provided by the present application will be described in detail with reference to the accompanying drawings.

Figure 1:
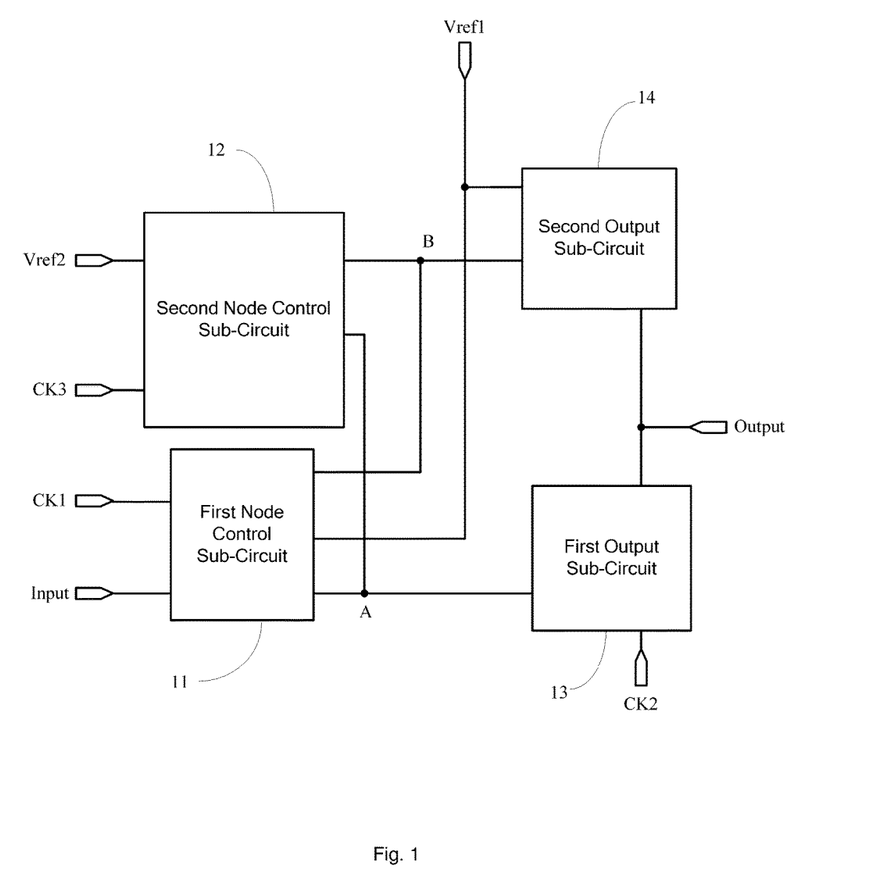
FIG. 1 shows a schematic structure diagram of a shift register according to an embodiment of the present application.

As shown in FIG. 1, a shift register provided by an embodiment of the present application comprises: a first node control sub-circuit 11, a second node control sub-circuit 12, a first output sub-circuit 13 and a second output sub-circuit 14.

The first node control sub-circuit 11 is connected to an input signal terminal Input, a first clock signal terminal CK1, a first reference signal terminal Vref1, a first node A and a second node B, respectively. The first node control sub-circuit 11 is configured to provide a signal of the input signal terminal Input to the first node A under control of the first clock signal terminal CK1, and provide a signal of the first reference signal terminal Vref1 to the first node A under control of the second node B.

The second node control sub-circuit 12 is connected to a second reference signal terminal Vref2, a third clock signal terminal CK3, the first node A and the second node B, respectively. The second node control sub-circuit 12 is configured to provide a signal of the second reference signal terminal Vref2 to the second node B under control of the third clock signal terminal CK3, and provide a signal of the third clock signal terminal CK3 to the second node B under control of the first node A.

The first output sub-circuit 13 is connected to the first node A, the second clock signal terminal CK2 and an output terminal Output of the shift register, respectively. The first output sub-circuit 13 is configured to provide a signal of the second clock signal terminal CK2 to the output terminal Output under control of the first node A for stabilizing a voltage difference between the first node A and the output terminal Output when the first node A is in a floating state.

The second output sub-circuit 14 is connected to the second node B, the first reference signal terminal Vref1 and the output terminal Output, respectively. The second output sub-circuit 14 is configured to provide the signal of the first reference signal terminal Vref1 to the output terminal Output under control of the second node B.

The above shift register provided by the present application comprises the first node control sub-circuit, the second node control sub-circuit, the first output sub-circuit and the second output sub-circuit. The first node control sub-circuit is configured to provide the signal of the input signal terminal to the first node under control of the first clock signal terminal, and provide the signal of the first reference signal terminal to the first node under control of the second node. The second node control sub-circuit is configured to provide the signal of the second reference signal terminal to the second node under control of the third clock signal terminal, and provide the signal of the third clock signal terminal to the second node under control of the first node. The first output sub-circuit is configured to provide a signal of the second clock signal terminal to the output terminal under control of the first node, for stabilizing the voltage difference between the first node and the output terminal when the first node is in a floating state. The second output sub-circuit is configured to provide the signal of the first reference signal terminal to the output terminal under control of the second node. By cooperation of the above four sub-circuits, the shift register may implement a shift output function with a simple structure, thereby reducing the production cost.

Hereinafter, the present application will be described in detail in conjunction with particular embodiments. It should be noted that the particular embodiments are illustrated for better explaining the present application, but do not limit the present application in any way.

In an example, in the above shift register provided by the embodiment of the present application, as shown in FIGS. 2a to 3b, the first node control sub-circuit 11 comprises: a first switch transistor M1 and a second switch transistor M2.

The first switch transistor M1 has a gate connected to the first clock signal terminal CK1, a source connected to the input signal terminal Input, and a drain connected to the first node A.

The second switch transistor M2 has a gate connected to the second node B, a source connected to the first reference signal terminal Vref1, and a drain connected to the first node A.

In a particular implementation, in the above shift register provided by the embodiment of the present application, when the first switch transistor M1 is in a turn-on state under control of the first clock signal terminal CK1, the turned-on first switch transistor M1 provides the signal of the input signal terminal Input to the first node A; and when the second switch transistor M2 is in a turn-on state under control of the second node B, the turned-on first switch transistor M2 provides the signal of the first reference signal terminal Vref1 to the first node A.

Figure 2A:
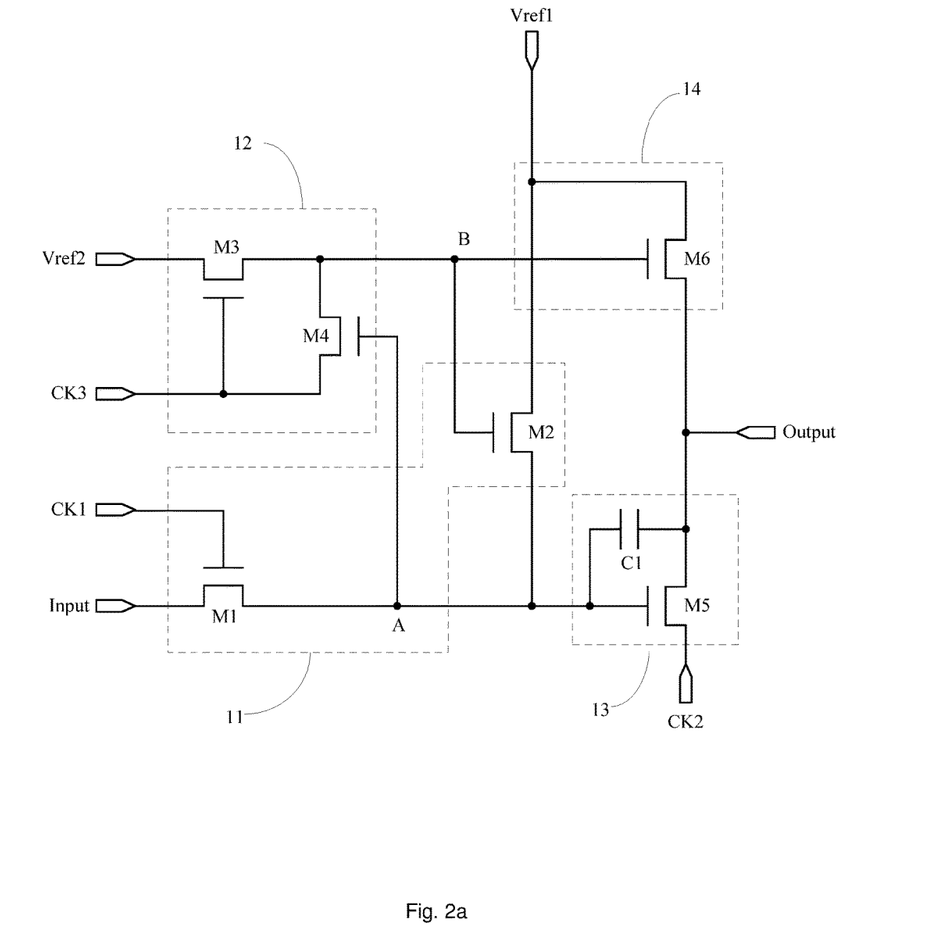
FIG. 2a shows a particular schematic structure diagram of a shift register according to an embodiment of the present application.
Figure 2B:
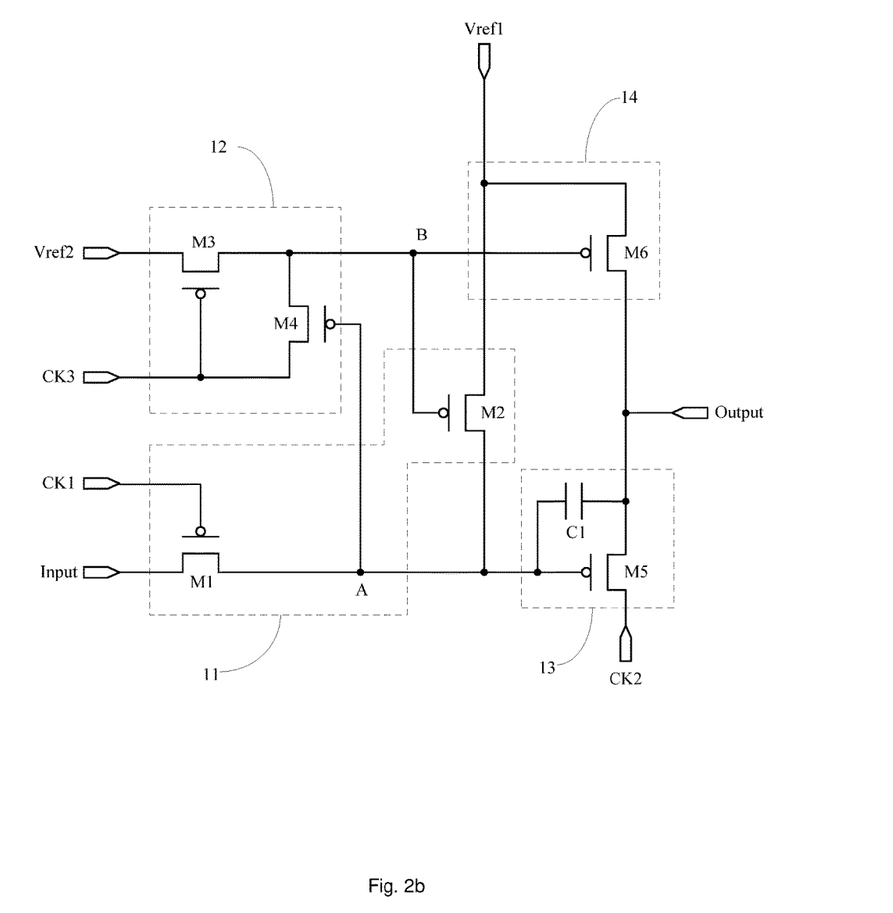
FIG. 2b shows a particular schematic structure diagram of a shift register according to another embodiment of the present application.
Figure 3A:
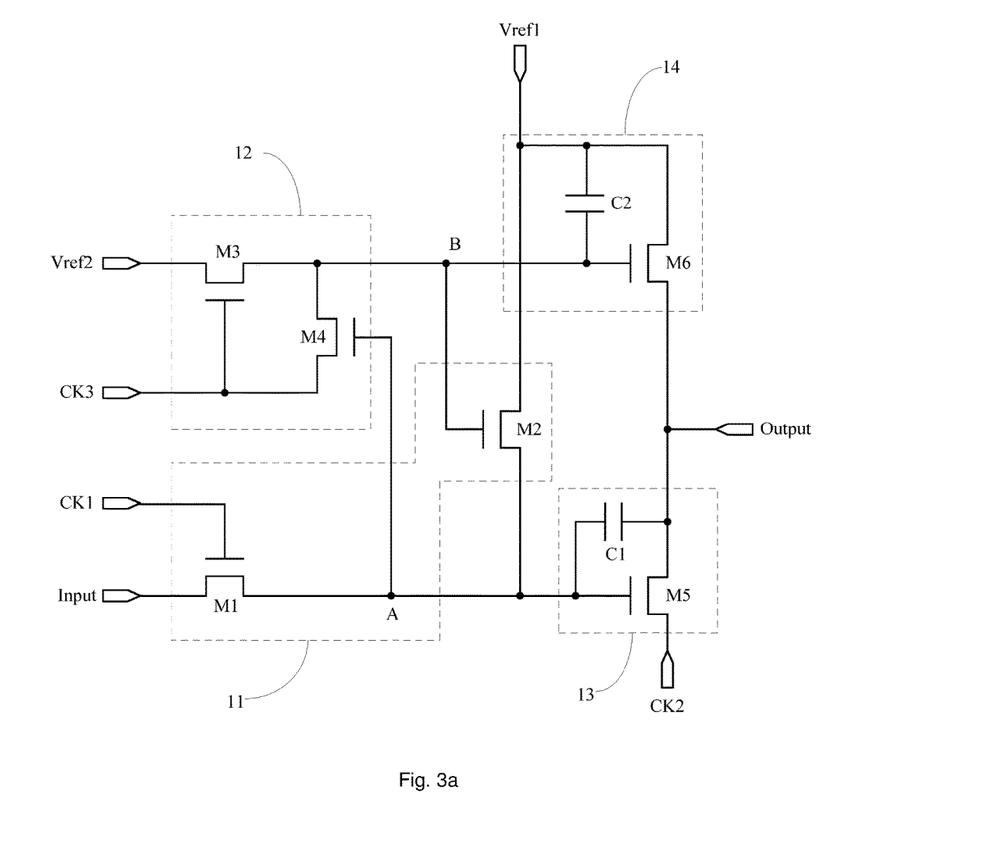
FIG. 3a shows a particular schematic structure diagram of a shift register according to yet another embodiment of the present application.
Figure 3B:
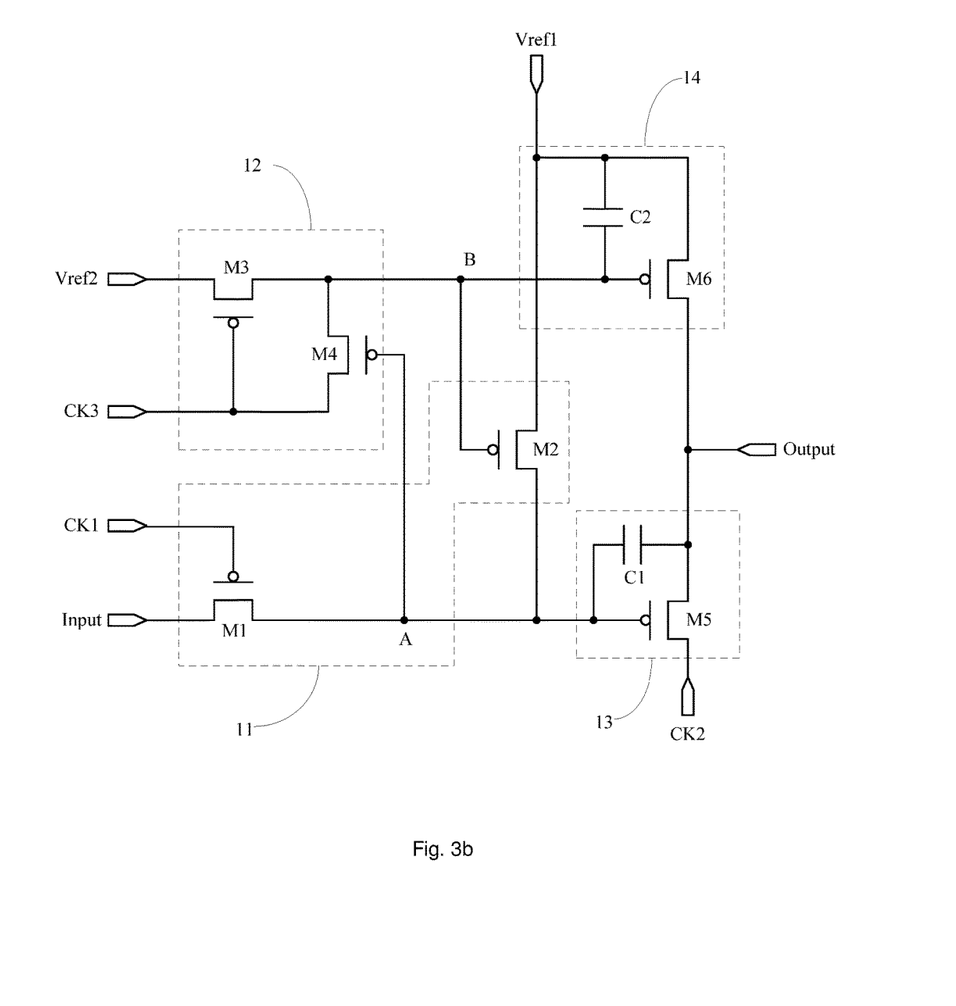
FIG. 3b shows a particular schematic structure diagram of a shift register according to yet another embodiment of the present application.

Further in a particular implementation, in the above shift register provided by the embodiment of the present application, as shown in FIGS. 2a and 3a, both the first switch transistor M1 and the second switch transistor M2 are N-type transistors; or, as shown in FIGS. 2b and 3b, both the first switch transistor M1 and the second switch transistor M2 are P-type transistors, which are not limited here.

In particular, the N-type transistor is turned on when its gate potential is high, and is turned off when its gate potential is low. The P-type transistor is turned on when its gate potential is low, and is turned off when the gate potential is high.

The above particular structure of the first node control sub-circuit in the shift register is only illustrated as an example. In practice, the particular structure of the first node control sub-circuit is not limited to this, and may be other structures known to the skilled in the art, which are not limited here.

In an example, in the above shift register provided by the embodiment of the present application, as shown in FIGS. 2a to 3b, the second node control sub-circuit 12 comprises: a third switch transistor M3 and a fourth switch transistor M4.

The third switch transistor M3 has a gate connected to the third clock signal terminal CK3, a source connected to the second reference signal terminal Vref2, and a drain connected to the second node B.

The fourth switch transistor M4 has a gate connected to the first node A, a source connected to the third clock signal terminal CK3, and a drain connected to the second node B.

In a particular implementation, in the above shift register provided by the embodiment of the present application, when the third switch transistor M3 is in a turn-on state under control of the third clock signal terminal CK3, the turned-on third switch transistor M3 provides the signal of the second reference signal terminal Vref2 to the second node B; and when the fourth switch transistor M4 is in a turn-on state under control of the first node A, the turned-on fourth switch transistor M4 provides the signal of the third clock signal terminal CK3 to the second node B.

Further in a particular implementation, in the above shift register provided by the embodiment of the present application, as shown in FIGS. 2a and 3a, both the third switch transistor M3 and the fourth switch transistor M4 are N-type transistors; or, as shown in FIGS. 2b and 3b, both the third switch transistor M3 and the fourth switch transistor M4 are P-type transistors, which are not limited here.

The above particular structure of the second node control sub-circuit in the shift register is only illustrated as an example. In practice, the particular structure of the second node control sub-circuit is not limited to this, and may be other structures known to the skilled in the art, which are not limited here.

In an example, in the above shift register provided by the embodiment of the present application, as shown in FIGS. 2a to 3b, the first output sub-circuit 13 comprises: a fifth switch transistor M5 and a first capacitor C1.

The fifth switch transistor M5 has a gate connected to the first node A, a source connected to the second clock signal terminal CK2, and a drain connected to the output terminal Output.

The first capacitor C1 is connected between the gate and the drain of the fifth switch transistor M5.

In a particular implementation, in the above shift register provided by the embodiment of the present application, when the fifth switch transistor M5 is in a turn-on state under control of the first node A, the turned-on fifth switch transistor M5 provides the signal of the second clock signal terminal CK2 to the output terminal Output. When the first node A is in the floating state, a potential of the first node A is varied with variation of a potential of the output terminal Output due to bootstrap of the first capacitor C1, so that the voltage difference between the first node A and the output terminal Output is kept to be stable.

Further in a particular implementation, in the above shift register provided by the embodiment of the present application, as shown in FIGS. 2a and 3a, the fifth switch transistor M5 is a N-type transistor; or, as shown in FIGS. 2b and 3b, the fifth switch transistor M5 is a P-type transistor, which are not limited here.

The above particular structure of the first output sub-circuit in the shift register is only illustrated as an example. In practice, the particular structure of the first output sub-circuit is not limited to this, and may be other structures known to the skilled in the art, which are not limited here.

In an example, in the above shift register provided by the embodiment of the present application, as shown in FIGS. 2a and 2b, the second output sub-circuit 14 comprises: a sixth switch transistor M6.

The sixth switch transistor M6 has a gate connected to the second node B, a source connected to the first reference signal terminal Vref1, and a drain connected to the output terminal Output.

In a particular implementation, in the above shift register provided by the embodiment of the present application, when the sixth switch transistor M6 is in a turn-on state under control of the second node B, the turned-on sixth switch transistor M6 provides the signal of the first reference signal terminal Vref1 to the output terminal Output.

Further in a particular implementation, in the above shift register provided by the embodiment of the present application, as shown in FIG. 2a, the sixth switch transistor M6 is a N-type transistor; or, as shown in FIG. 2b, the sixth switch transistor M6 is a P-type transistor, which are not limited here.

In an example, in order to stabilize the gate voltage of the sixth switch transistor M6, in the above shift register provided by the embodiment of the present application, as shown in FIGS. 3a and 3b, the second output sub-circuit 14 further comprises a second capacitor C2 connected between the gate and the source of the sixth switch transistor M6.

The above particular structure of the second output sub-circuit in the shift register is only illustrated as an example. In practice, the particular structure of the second output sub-circuit is not limited to this, and may be other structures known to the skilled in the art, which are not limited here.

It should be noted that the switch transistors mentioned in the above embodiments of the present application may be thin film transistors (TFTs), or a metal oxide semiconductor field transistors (MOSs, Metal Oxide Semiconductors), which are not limited here. In particular implementations, functions of the sources and the drains of these switch transistors are interchangeable depending on different transistor types and input signals, and thus no specific distinctions are made here.

In an example, in the above shift register provided by the embodiment of the present application, in order to simplify the manufacturing process, polarities of all of switch transistors are designed to be identical. As shown in FIGS. 2a and 3a, all of the switch transistors (M1, M2, M3, M4, M5 and M6) are N-type transistors, or as shown in FIGS. 2*b* and 3*b*, all of the switch transistors (M1, M2, M3, M4, M5 and M6) are P-type transistors.

Further, in the above shift register provided by the embodiment of the present application, as shown in FIGS. 2*a* and 3*a*, when all of the switch transistors (M1, M2, M3, M4, M5 and M6) are N-type transistors, the potential of the first reference signal terminal Vref1 is low, and the potential of the second reference signal terminal Vref2 is high. As shown in FIGS. 2*b* and 3*b*, when all of the switch transistors (M1, M2, M3, M4, M5 and M6) are P-type transistors, the potential of the first reference signal terminal Vref1 is high, and the potential of the second reference signal terminal Vref2 is low.

Hereinafter, an operation process of the above shift register provided by the embodiment of the present application will be described in conjunction with a circuit timing diagram. In the following description, 1 indicates a high potential level, and 0 indicates a low potential level, wherein 1 and 0 represent their logic potential, which are illustrated for better explaining the operation process of the above shift register provided by the embodiment of the present application only, but are not potentials applied to the gates of the respective switch transistors in a particular application.

Figure 4A:
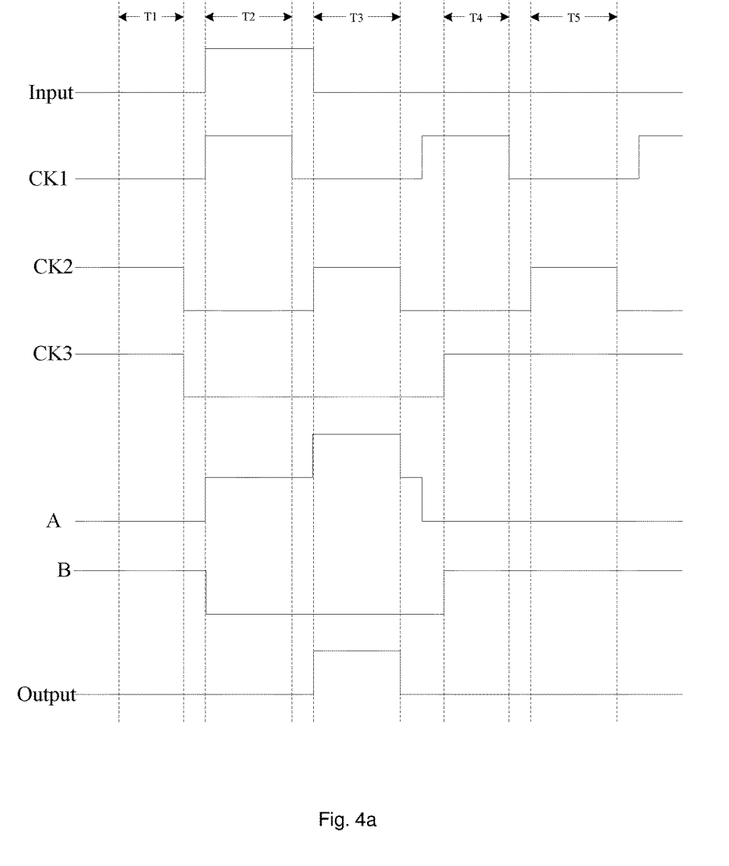

Taking the structure of the shift register shown in FIG. 3*a* as an example, the operation process of the shift register shown in FIG. 3*a* will be described. In the shift register shown in FIG. 3*a*, all of the switch transistors are N-type switch transistors. The potential of the first reference signal terminal Vref1 is low, and the potential of the second reference signal terminal Vref2 is high. A corresponding input/output timing diagram is shown in FIG. 4*a*. Specifically, a first period T1, a second period T2, a third period T3, a fourth period T4, and a fifth period T5 are selected from the input/output timing diagram shown in FIG. 4*a*.

In the first period T1, Input=0, CK1=0, CK2=1, CK3=1.

Since CK3=1, the third switch transistor M3 is turned on, and the turned-on third switch transistor M3 provides the high potential signal of the second reference signal terminal Verf2 to the second node B. Thus, the potential of the second node B is high, and is kept by the second capacitor C2. The second node B controls the sixth switch transistor M6 and the second switch transistor M2 to be turned on, and the turned on second switch transistor M2 provides the low potential signal of the first reference signal terminal Verf1 to the first node A. Thus, the potential of the first node A is low, and is kept by the first capacitor C1. The first node A controls the fifth switch transistor to be turned off. Since CK1=0, the first switch transistor M1 is turned off. The sixth switch transistor M6 which is turned on under control of the second node B provides the low potential signal of the first reference signal terminal Verf1 to the output terminal Output. Thus, the potential of the output terminal Output is low.

In the second period T2, Input=1, CK1=1, CK2=0, CK3=0.

Since CK1=1, the first switch transistor M1 is turned on, and the turned-on first switch transistor M1 provides the high potential signal of the input signal terminal Input to the first node A. Thus, the potential of the first node A is high, and is kept by the first capacitor C1. The first node A controls the fourth switch transistor M4 and the fifth switch transistor M5 to be turned on, and the turned on fourth switch transistor M4 provides the low potential signal of the third clock signal terminal CK3 to the second node B. Thus, the potential of the second node B is low, and is kept by the second capacitor C2. The second node B controls the second switch transistor M2 and the sixth switch transistor M6 to be turned off. Since CK3=0, the third switch transistor M3 is turned off. The fifth switch transistor M5 which is turned on under control of the first node A provides the low potential signal of the second clock signal terminal CK2 to the output terminal Output. Thus, the potential of the output terminal Output is low.

In the third period T3, Input=0, CK1=0, CK2=1, CK3=0.

Since CK1=0, the first switch transistor M1 is turned off. Since CK3=0, the third switch transistor M3 is turned off. Since the first node A is in the floating state, the potential of the first node A is still high, the second switch transistor M2 is turned on, and the turned-on second switch transistor M2 provides the high potential signal of the second clock signal terminal CK2 to the output terminal Output. Thus, the potential of the output terminal Output is high. Due to the bootstrap effect of the first capacitor C1, the potential of the output terminal Output is changed from low at the second period T2 to high. Thus, the potential of the first node A is further pulled up to ensure that the second switch transistor M2 is turned on more sufficiently, so that the high potential signal of the second clock signal terminal CK2 is completely inputted to the output terminal Output. At this period, since the potential of the first node A is high, the fourth switch transistor M4 is turned on, and the turned-on fourth switch transistor M4 provides the low potential signal of the third clock signal CK3 to the second node B. Thus, the potential of the second node B is low and is kept by the second capacitor C2, and the sixth switch transistor M6 is turned off.

In the fourth period T4, Input=0, CK1=1, CK2=0, CK3=1.

Since CK1=1, the first switch transistor M1 is turned on, and the turned-on first switch transistor M1 provides the low potential signal of the input signal terminal Input to the first node A. Thus, the potential of the first node A is low, and is kept by the first capacitor C1. The first node A controls the fourth switch transistor M4 and the fifth switch transistor M5 to be turned off. Since CK3=1, the third switch transistor M3 is turned on, and the turned-on third switch transistor M3 provides the high potential signal of the second reference signal terminal Vref2 to the second node B. Thus, the potential of the second node B is high, and is kept by the second capacitor C2. The second node B controls the second switch transistor M2 and the sixth switch transistor M6 to be turned on. The turned-on second switch transistor M2 provides the low potential signal of the first reference signal terminal Vref1 to the first node A, further ensuring the fourth switch transistor M4 and the fifth switch transistor M5 to be turned off. The turned-on sixth switch transistor M6 provides the low potential signal of the first reference signal terminal Vref1 to the output terminal Output, and thus the potential of the output terminal Output is low.

In the fifth period T5, Input=0, CK1=0, CK2=1, CK3=1.

Since CK3=1, the third switch transistor M3 is turned on, and the turned-on third switch transistor M3 provides the high potential signal of the second reference signal terminal Verf2 to the second node B. Thus, the potential of the second node B is high, and is kept by the second capacitor C2. The second node B controls the sixth switch transistor M6 and the second switch transistor M2 to be turned on, and the turned-on second switch transistor M2 provides the low potential signal of the first reference signal terminal Verf1 to the first node A. Thus, the first node A is low and is kept by the first capacitor C1. The first node A controls the fifth switch transistor to be turned off. Since CK1=0, the first switch transistor is turned off. The sixth switch transistor M6 which is turned on under control of the second node B provides the low potential signal of the first reference signal terminal Verf1 to the output terminal Output. Thus, the potential of the output terminal Output is low.

In the above shift register provided by the embodiment of the present application, after the fifth period, the operation processes of the fourth period and the fifth period are repeated to ensure that the potential of the output terminal is kept low.

Figure 4B:
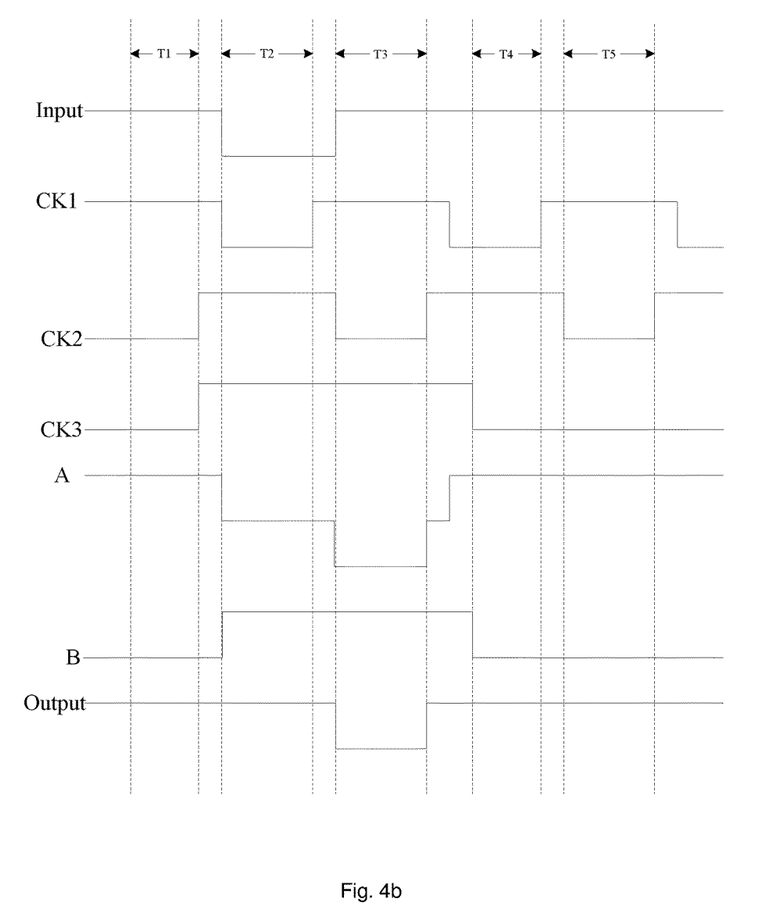
FIG. 4b shows a circuit timing diagram of the shift register shown in FIG. 3b.

Taking the structure of the shift register shown in FIG. 3b as an example, the operation process of the shift register shown in FIG. 3b will be described. In the shift register shown in FIG. 3b, all of the switch transistors are P-type switch transistors. The potential of the first reference signal terminal Vref1 is high, and the potential of the second reference signal terminal Vref2 is low. A corresponding input/output timing diagram is shown in FIG. 4b. Specifically, a first period T1, a second period T2, a third period T3, a fourth period T4, and a fifth period T5 are selected from the input/output timing diagram shown in FIG. 4b.

In the first period T1, Input=1, CK1=1, CK2=0, CK3=0.

Since CK3=0, the third switch transistor M3 is turned on, and the turned-on third switch transistor M3 provides the high potential signal of the second reference signal terminal Verf2 to the second node B. Thus, the potential of the second node B is low, and is kept by the second capacitor C2. The second node B controls the sixth switch transistor M6 and the second switch transistor M2 to be turned on, and the turned on second switch transistor M2 provides the high potential signal of the first reference signal terminal Verf1 to the first node A. Thus, the potential of the first node A is high, and is kept by the first capacitor C1. The first node A controls the fifth switch transistor to be turned off. Since CK1=1, the first switch transistor M1 is turned off. The sixth switch transistor M6 which is turned-on under control of the second node B provides the high potential signal of the first reference signal terminal Verf1 to the output terminal Output. Thus, the potential of the output terminal Output is high.

In the second period T2, Input=0, CK1=0, CK2=1, CK3=1.

Since CK1=0, the first switch transistor M1 is turned on, and the turned-on first switch transistor M1 provides the low potential signal of the input signal terminal Input to the first node A. Thus, the potential of the first node A is low, and is kept by the first capacitor C1. The first node A controls the fourth switch transistor M4 and the fifth switch transistor M5 to be turned on, and the turned on fourth switch transistor M4 provides the high potential signal of the third clock signal terminal CK3 to the second node B. Thus, the potential of the second node B is high, and is kept by the second capacitor C2. The second node B controls the second switch transistor M2 and the sixth switch transistor M6 to be turned off. Since CK3=1, the third switch transistor M3 is turned off. The fifth switch transistor M5 which is turned on under control of the first node A provides the high potential signal of the second clock signal terminal CK2 to the output terminal Output. Thus, the potential of the output terminal Output is high.

In the third period T3, Input=1, CK1=1, CK2=0, CK3=1.

Since CK1=1, the first switch transistor M1 is turned off. Since CK3=1, the third switch transistor M3 is turned off. Since the first node A is in the floating state, the potential of the first node A is still low, the second switch transistor M2 is turned on, and the turned-on second switch transistor M2 provides the low potential signal of the second clock signal terminal CK2 to the output terminal Output. Thus, the potential of the output terminal Output is low. Due to the bootstrap effect of the first capacitor C1, the potential of the output terminal Output is changed from high at the second period T2 to low. Thus, the potential of the first node A is further pulled down to ensure that the second switch transistor M2 is turned on more sufficiently, so that the low potential signal of the second clock signal terminal CK2 is completely inputted to the output terminal Output. At this period, since the potential of the first node A is low, the fourth switch transistor M4 is turned on, and the turned-on fourth switch transistor M4 provides the high potential signal of the third clock signal CK3 to the second node B. Thus, the potential of the second node B is high and is kept by the second capacitor C2, and the sixth switch transistor M6 is turned off.

In the fourth period T4, Input=1, CK1=0, CK2=1, CK3=0.

Since CK1=0, the first switch transistor M1 is turned on, and the turned-on first switch transistor M1 provides the high potential signal of the input signal terminal Input to the first node A. Thus, the potential of the first node A is high, and is kept by the first capacitor C1. The first node A controls the fourth switch transistor M4 and the fifth switch transistor M5 to be turned off. Since CK3=0, the third switch transistor M3 is turned on, and the turned-on third switch transistor M3 provides the low potential signal of the second reference signal terminal Vref2 to the second node B. Thus, the potential of the second node B is low, and is kept by the second capacitor C2. The second node B controls the second switch transistor M2 and the sixth switch transistor M6 to be turned on. The turned-on second switch transistor M2 provides the high potential signal of the first reference signal terminal Vref1 to the first node A, further ensuring the fourth switch transistor M4 and the fifth switch transistor M5 to be turned off. The turned-on sixth switch transistor M6 provides the high potential signal of the first reference signal terminal Vref1 to the output terminal Output, and thus the potential of the output terminal Output is high.

In the fifth period T5, Input=1, CK1=1, CK2=0, CK3=0.

Since CK3=0, the third switch transistor M3 is turned on, and the turned-on third switch transistor M3 provides the low potential signal of the second reference signal terminal Verf2 to the second node B. Thus, the potential of the second node B is low, and is kept by the second capacitor C2. The second node B controls the sixth switch transistor M6 and the second switch transistor M2 to be turned on, and the turned-on second switch transistor M2 provides the high potential signal of the first reference signal terminal Verf1 to the first node A. Thus, the first node A is high and is kept by the first capacitor C1. The first node A controls the fifth switch transistor to be turned off. Since CK1=1, the first switch transistor is turned off. The sixth switch transistor M6 which is turned on under control of the second node B provides the high potential signal of the first reference signal terminal Verf1 to the output terminal Output. Thus, the potential of the output terminal Output is high.

In the above shift register provided by the embodiment of the present application, after the fifth period, the operation processes of the fourth period and the fifth period are repeated to ensure that the potential of the output terminal is kept high.

Figure 5:
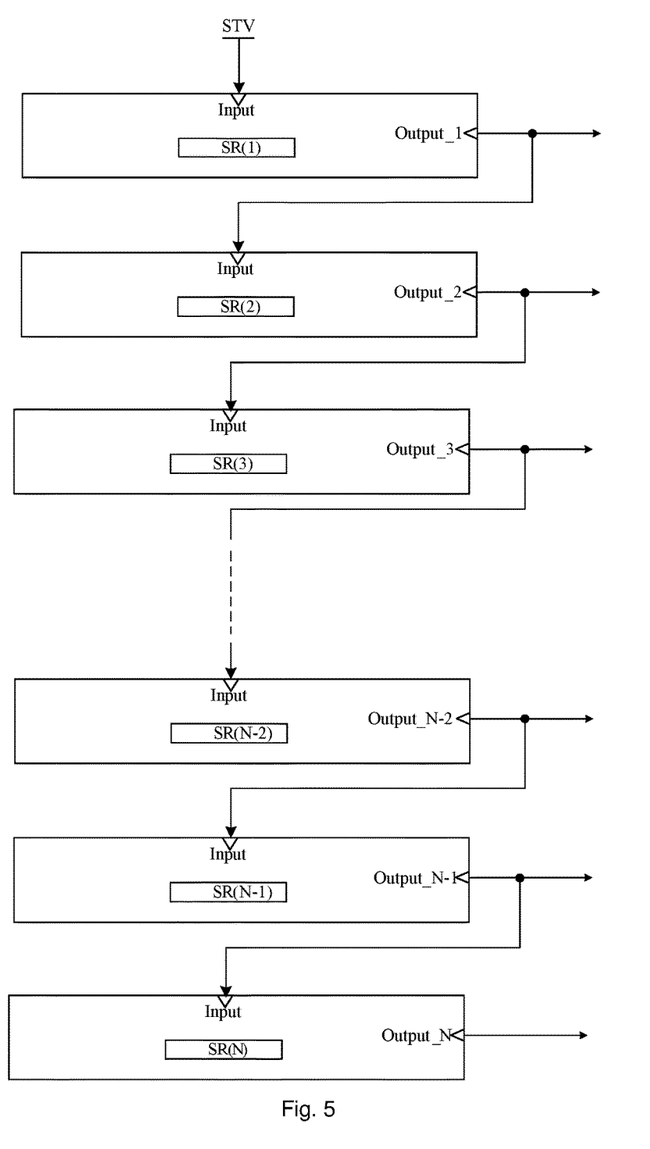
FIG. 5 shows a schematic structure diagram of a gate drive circuit according to an embodiment of the present application.

Based on the same inventive concept, an embodiment of the present application also provides a gate drive circuit, as shown in FIG. 5, comprising a plurality of cascaded shift registers: SR(1), SR(2) . . . SR(n) . . . SR(N−1), SR(N) (N shift registers in total, 1≤n≤N). An input signal terminal Input of a first stage of shift register SR(1) is connected to a start signal terminal STV, and an input signal terminal of each of stages of shift registers SR(n) other than the first stage of shift register SR(1) is connected to an output terminal Output_n−1 of its previous stage of shift register SR(n−1).

Specifically, particular functions and structure of each of the shift registers in the above gate drive circuit are identical with those of the shift register of the present application as previously described, and thus repetitive description thereof will be omitted here.

Based on the same inventive concept, an embodiment of the present application also provides a display panel, including the above gate drive circuit provided in the embodiment of the present application. The display panel may be a mobile phone, a tablet, a TV, a monitor, a laptop, a digital photo frame, a navigator and any other products or components with display functions. Other components essential for the display panel are those that should be understood by the skilled in the art to be necessary, and thus descriptions thereof are omitted here and should not to be construed as a limitation on the present application.

In practical implementations, the above display panel provided by the embodiment of the present application may be a liquid crystal display panel, or an organic electroluminescent display panel, which are not limited here.

Further, when the above display panel provided by the embodiment of the present application is an organic electroluminescent display panel, the display panel is generally configured with organic electroluminescent pixels which are arranged in a matrix arrangement. When each row of the organic electroluminescent pixels emits light for display, generally within a frame of time, it firstly implements data write-in under control of a scan signal, and then displays based on the written-in data under control of a light-emitting control terminal. Therefore, within one frame of time, a signal of the light-emitting control terminal controls the organic electroluminescent pixels to be off only in a short period of time, and controls the organic electroluminescent pixels to emit light in the rest of time, so as to ensure that the organic electroluminescent pixels emit light and display during a display period. And generally, when the signal of the light-emitting terminal controls the organic electroluminescent pixels to be off, a gate scan signal for controlling data write-in of the organic electroluminescent pixels begins to be output, so as to write a data voltage signal in the organic electroluminescent pixels. After the data voltage signal is written-in, the signal control of the light-emitting control terminal begins to control the organic electroluminescent pixels to emit light, and the organic electroluminescent pixels then emit light with a brightness controlled by the written-in data voltage signal.

Therefore in practical implementations, when the above display panel provided by the embodiment of the present application is an organic electroluminescent display panel, the display panel further comprises organic electroluminescent pixel rows which are respectively corresponding to the respective stages of shift registers in the gate drive circuit.

Each of the organic electroluminescent pixel rows emits light under control of corresponding light-emitting control terminal, and the light-emitting control terminal corresponding to each of the respective organic electroluminescent pixel rows is connected to the third clock signal terminal of the corresponding stage of shift register. That is, the light-emitting control terminal corresponding to each of the organic electroluminescent pixel rows is used as the third clock signal terminal of the corresponding stage of shift register in the gate drive circuit so that arrangement of signal lines may be reduced, which enables the structure of the gate drive circuit in the display panel to be relatively simple.

The above embodiments of the present application provide the shift register, the gate drive circuit and the display panel. The shift register comprises: the first node control sub-circuit, the second node control sub-circuit, the first output sub-circuit and the second output sub-circuit. The first node control sub-circuit is configured to provide the signal of the input signal terminal to the first node under control of the first clock signal terminal, and provide the signal of the first reference signal terminal to the first node under control of the second node. The second node control sub-circuit is configured to provide the signal of the second reference signal terminal to the second node under control of the third clock signal terminal, and provide the signal of the third clock signal terminal to the second node under control of the first node. The first output sub-circuit is configured to provide the signal of the second clock signal terminal to the output terminal under control of the first node, for stabilizing the voltage difference between the first node and the output terminal when the first node is in a floating state; and the second output sub-circuit is configured to provide the signal of the first reference signal terminal to the output terminal under control of the second node. By cooperation of the above four sub-circuits, the shift register may implement the shift output function with the simple structure, thereby reducing the production cost.

It may be understood that the above implementations are only exemplary implementations for illustrating the principles of the present application, but the present application is not limited to these. For the skilled in the art, various variations and improvements may be made without being apart from the sprit and substance of the present application, which also fall into the protection scope of the present application.

I claim:

1. A shift register, comprising:
   a first node control sub-circuit, which is connected to an input signal terminal, a first clock signal terminal, a first reference signal terminal, a first node and a second node respectively, the first node control sub-circuit being configured to provide a signal of the input signal terminal to the first node under control of the first clock signal terminal, and provide a signal of the first reference signal terminal to the first node under control of the second node;
   a second node control sub-circuit, which is connected to a second reference signal terminal, a third clock signal terminal, the first node and the second node respectively, the second node control sub-circuit being configured to provide a signal of the second reference signal terminal to the second node under control of the third clock signal terminal, and provide a signal of the third clock signal terminal to the second node under control of the first node;
   a first output sub-circuit, which is connected to the first node, a second clock signal terminal and an output terminal of the shift register respectively, the first output sub-circuit being configured to provide a signal of the second clock signal terminal to the output terminal under control of the first node for stabilizing a voltage difference between the first node and the output terminal when the first node is in a floating state; and
   a second output sub-circuit, which is connected to the second node, the first reference signal terminal and the output terminal respectively, the second output sub-circuit being configured to provide the signal of the first reference signal terminal to the output terminal under control of the second node.

2. The shift register according to claim 1, wherein the first node control sub-circuit comprises: a first switch transistor and a second switch transistor, wherein
- the first switch transistor has a gate connected to the first clock signal terminal, a source connected to the input signal terminal, and a drain connected to the first node; and
- the second switch transistor has a gate connected to the second node, a source connected to the first reference signal terminal, and a drain connected to the first node.

3. The shift register according to claim 2, wherein both the first switch transistor and the second switch transistor are P-type transistors or N-type transistors.

4. The shift register according to claim 1, wherein the second node control sub-circuit comprises: a third switch transistor and a fourth switch transistor, wherein
- the third switch transistor has a gate connected to the third clock signal terminal, a source connected to the second reference signal terminal, and a drain connected to the second node; and
- the fourth switch transistor has a gate connected to the first node, a source connected to the third clock signal terminal, and a drain connected to the second node.

5. The shift register according to claim 4, wherein both the third switch transistor and the fourth switch transistor are P-type transistors or N-type transistors.

6. The shift register according to claim 1, wherein the first output-sub-circuit comprises: a fifth switch transistor and a first capacitor, wherein
- the fifth switch transistor has a gate connected to the first node, a source connected to the second clock signal terminal, and a drain connected to the output terminal; and
- the first capacitor is connected between the gate and the drain of the fifth switch transistor.

7. The shift register according to claim 6, wherein the fifth switch transistor is a P-type transistor or an N-type transistor.

8. The shift register according to claim 1, wherein the second output sub-circuit comprises: a sixth switch transistor, wherein
- the sixth switch transistor has a gate connected to the second node, a source connected to the first reference signal terminal, and a drain connected to the output terminal.

9. The shift register according to claim 8, wherein the second output sub-circuit further comprises: a second capacitor connected between the gate and the source of the sixth switch transistor.

10. The shift register according to claim 8, wherein the sixth switch transistor is a P-type transistor or a N-type transistor.

11. A gate drive circuit, comprising a plurality of cascaded shift registers according claim 1, wherein
- an input signal terminal of a first stage of shift register is connected to a start signal terminal; and
- an input signal terminal of each of stages of shift registers other than the first stage of shift register is connected to an output terminal of its previous stage of shift register.

12. A display panel, comprising a gate drive circuit according to claim 11.

13. The display panel according to claim 12, further comprising: organic electroluminescent pixel rows which are respectively corresponding to the respective stages of shift registers in the gate drive circuit, wherein
- each of the organic electroluminescent pixel rows emits light under control of a corresponding light-emitting control terminal, and a light-emitting control terminal corresponding to each of the organic electroluminescent pixel rows is connected to the third clock signal terminal of the corresponding stage of shift register.

* * * * *